United States Patent
Zhou et al.

(10) Patent No.: US 9,227,182 B2
(45) Date of Patent: *Jan. 5, 2016

(54) PLATING CATALYST AND METHOD

(71) Applicant: Rohm and Haas Electronic Materials LLC, Marlborough, MA (US)

(72) Inventors: Wenjia Zhou, Fanling (HK); Suk Kwan Kwong, Ngau Tau Kok (HK); Dennis Chit Yiu Chan, Shatin (HK); Dennis Kwok Wai Yee, Yuen Long (HK); Weijuan Zhou, Tai Po Tai Wo Road (HK)

(73) Assignee: Rohm and Haas Electronic Materials LLC

(*) Notice: Subject to any disclaimer, the term of this patent is extended or adjusted under 35 U.S.C. 154(b) by 460 days.

This patent is subject to a terminal disclaimer.

(21) Appl. No.: 13/732,271

(22) Filed: Dec. 31, 2012

(65) Prior Publication Data
US 2013/0171366 A1 Jul. 4, 2013

Related U.S. Application Data

(60) Provisional application No. 61/582,264, filed on Dec. 31, 2011.

(51) Int. Cl.
| | |
|---|---|
| *C23C 18/30* | (2006.01) |
| *B01J 31/06* | (2006.01) |
| *C23C 18/18* | (2006.01) |
| *C23C 18/40* | (2006.01) |
| *H05K 3/42* | (2006.01) |

(52) U.S. Cl.
CPC ............ *B01J 31/06* (2013.01); *C23C 18/1844* (2013.01); *C23C 18/1893* (2013.01); *C23C 18/40* (2013.01); *H05K 3/422* (2013.01); *H05K 2203/0307* (2013.01); *H05K 2203/072* (2013.01)

(58) Field of Classification Search
CPC  C23C 18/1844; C23C 18/2086; C23C 18/30; C23C 18/40; B01J 23/38; B01J 23/42; B01J 23/44; B01J 23/46; B01J 23/462; B01J 23/464; B01J 23/466; B01J 23/468; B01J 23/48; B01J 23/50; B01J 23/52; B01J 31/06; B01J 37/0219; B01J 37/16; H05K 3/422
USPC .............. 106/1.11, 1.18, 1.19, 1.21; 502/159; 427/443.1
See application file for complete search history.

(56) References Cited

U.S. PATENT DOCUMENTS

| | | | |
|---|---|---|---|
| 3,011,920 A | 12/1961 | Shipley, Jr. et al. | |
| 3,904,792 A | 9/1975 | Gulla et al. | |
| 3,993,799 A | 11/1976 | Feldstein | |
| 4,004,051 A * | 1/1977 | Kadison et al. | 106/1.11 |
| 4,652,311 A * | 3/1987 | Gulla et al. | 106/1.11 |
| 4,719,145 A * | 1/1988 | Neely | 502/159 |
| 4,725,314 A | 2/1988 | Gulla et al. | |
| 6,325,910 B1 * | 12/2001 | Meyer et al. | 205/159 |
| 6,645,557 B2 | 11/2003 | Joshi | |
| 7,166,152 B2 | 1/2007 | Okuhama et al. | |
| 7,718,710 B2 * | 5/2010 | Zhang et al. | 516/97 |
| 7,824,580 B2 * | 11/2010 | Boll et al. | 106/1.18 |
| 8,383,014 B2 * | 2/2013 | Vanheusden et al. | 252/512 |
| 2004/0043153 A1 | 3/2004 | Okuhama et al. | |
| 2005/0118436 A1 * | 6/2005 | Bhangale et al. | 428/457 |
| 2009/0263496 A1 * | 10/2009 | Kijlstra et al. | 106/1.05 |
| 2010/0084599 A1 | 4/2010 | Lewis et al. | |
| 2011/0014473 A1 * | 1/2011 | Ying et al. | 428/407 |
| 2011/0303885 A1 | 12/2011 | Vanheusden et al. | |
| 2012/0171363 A1 * | 7/2012 | Yamamoto et al. | 106/1.11 |
| 2013/0171363 A1 * | 7/2013 | Zhou et al. | 502/159 |
| 2014/0242287 A1 * | 8/2014 | Kwong et al. | 502/159 |

FOREIGN PATENT DOCUMENTS

| | | |
|---|---|---|
| JP | 10229280 | 8/1998 |
| JP | 11241170 A | 9/1999 |
| JP | 2001044242 A | 2/2001 |
| WO | WO 2008/094144 A1 * | 8/2008 |

OTHER PUBLICATIONS

Baypure DS 100 Material Safety Data Sheet (MSDS); 7 pages; no date available.*
Mayer, et al., Investigation of Polymer-Protected Noble Metal Nanoparticles by Transmission Electron Microscopy: Control of Particle Morphology and Shape, Colloid Polymer Science, (1998), pp. 769-779.
European Search Report corresponding to EP12199767 dated Apr. 4, 2014.

* cited by examiner

*Primary Examiner* — Helene Klemanski
(74) *Attorney, Agent, or Firm* — John J. Piskorski

(57) ABSTRACT

A solution including a precious metal nanoparticle and a polymer polymerized from a monomer comprising at least a monomer having two or more carboxyl groups or carboxylic acid salt groups. The solution is useful for a catalyst for a process of electroless plating of a metal on non-conductive surface.

8 Claims, No Drawings

PLATING CATALYST AND METHOD

FIELD OF THE INVENTION

The present invention relates to a catalyst solution containing a precious metal nanoparticle. More particularly, the present invention is directed to a catalyst solution containing a precious metal nanoparticle stabilized by specific compounds useful in electroless metal plating of non-conductive substrates used in the manufacture of electronic devices and decorative coating.

BACKGROUND OF THE INVENTION

Electroless metal deposition or plating is useful for the deposition of a metal or mixture of metals on a non-conductive or dielectric surface in the absence of an electric source. Plating on non-conductive or dielectric substrates may be used in a wide variety of applications, including decorative plating and electronic devices fabrication. One of the main applications is the manufacture of printed circuit boards. The electroless deposition of a metal on a substrate usually requires pretreatment or sensitization of the substrate surface to make the surface catalytic to the deposition process. Various methods have been developed to catalyze substrates. U.S. Pat. No. 3,011,920 discloses a method to catalyze a substrate by immersion of the substrate in the colloidal catalyst solution prepared by palladium ions with stannous ions to form a palladium-tin colloid. This method requires a step of acceleration after catalyzing the substrate surface whereby the catalyst core is exposed. U.S. Pat. No. 3,904,792 discloses an improved colloidal palladium-tin catalyst which provides a catalyst in a less acidic environment. A hydrochloric acid is replaced partially by another soluble salt of the acid. Such a palladium-tin catalyst system still presents a number of limitations. The outer shell of the catalyst colloid $SnCl_4^{2-}$ is easily oxidized, thus the catalyst particles grow in size and lose their catalytic surface area dramatically.

U.S. Pat. No. 4,725,314 discloses a process for the preparation of a catalytic adsorbate in aqueous solution using an organic suspending agent to protect colloid with a maximum dimension not to exceed 500 angstroms. Polyvinyl pyrrolidone could serve as an organic suspending agent.

Because of the high cost of palladium, considerable effort has been put on the development of non-noble metal catalyst systems. U.S. Pat. No. 3,993,799 discloses the use of a non-noble metal hydrous oxide colloid for treating non-conductive substrates followed by reduction of the hydrous oxide coating on the substrate to achieve at least a degree of activation for subsequent electroless plating. U.S. Pat. No. 6,645,557 discloses a method to form a conductive metal layer by contacting the non-conductive surface with an aqueous solution containing a stannous salt to form a sensitized surface followed by contacting the sensitized surface with an aqueous solution containing a silver salt having a pH in the range from about 5 to about 10 to form a catalyzed surface. JP10229280A discloses a catalyst solution which is composed of silver nitrate or copper sulfate, as well as an anionic surfactant, such as polyoxyethylene lauryl ether sodium sulfate and a reducing agent such as sodium borohydride. JP11241170A discloses a non-palladium catalyst containing at least one of iron, nickel, cobalt and silver salt in conjunction with an anionic surfactant and a reducing agent. JP2001044242A discloses a manufacturing method for preparation of a high dispersing colloidal metal solution with high conductivity, which contains at least one amino group and one carboxyl group. U.S. Pat. No. 7,166,152 discloses a sliver colloid based pretreatment solution comprising three components: (i) sliver colloidal particles; (ii) one or more ions selected from metal ions having an electric potential which can reduce a sliver ion to silver metal in the solution; and (iii) one or more ions selected from a hydroxycarboxylate ion, a condensed phosphate ion and an amine carboxylate ion.

Normally, aqueous solutions of colloidal silver nanoparticles are tin-free catalysts. They are much more stable than those systems containing stannous ions, which are easily oxidized to tin (IV) with air agitation. Such colloidal silver catalyst systems would reduce cost and be less affected by the unstable precious metals than palladium systems. Such a colloidal silver catalyst system also shows promising catalytic properties in electroless plating processes without sacrificing the interconnect reliability.

Therefore, a colloidal catalyst system which has bath stability, adsorption capability and catalytic activity at the same time is desired.

SUMMARY OF THE INVENTION

A solution including a precious metal nanoparticle and a polymer, the polymer is polymerized from a monomer which includes at least a monomer having two or more carboxyl groups or carboxylic acid salt groups.

A process for electroless plating a metal on non-conductive surfaces, the process includes the steps of dipping a substrate to be plated into a solution including a precious metal nanoparticle and a polymer, the polymer is polymerized from a monomer which includes at least a monomer having two or more carboxyl groups or carboxylic acid salt groups; and conducting electroless plating of the substrate without an accelerating step.

Inventors of this invention have now found that a precious metal colloidal catalyst system which includes precious metal nanoparticles stabilized by a specific type of polymer polymerized from a monomer including at least a monomer having two or more carboxyl groups or carboxylic acid salt groups and tin-free showed a balance of a good stability and promising catalytic activity towards electroless plating. In addition, such colloidal catalyst systems have a wide operation window, i.e., works effectively through a wide pH range, thus it is useful for industrial operations.

DETAILED DESCRIPTION OF THE INVENTION

As used throughout this specification the abbreviations given below have the following meanings, unless the content clearly indicates otherwise: g=gram; mg=milligram; ml=milliliter; L=liter; m=meter; min.=minute; s=second; h=hour; ppm=parts per million; M=molar; g/L=grams per liter; cm=centimeter; mmol=millimoles; rpm=revolutions per minute; Ag=silver; Cu=copper; PAA=polyacrylic acid; and PESA=polyepoxysuccinic acid.

As used throughout this specification the word "deposition" and "plating" are used interchangeably. The word "catalyzing" and "activating" are used interchangeably throughout this specification. The word "solution comprising precious metal nanoparticle" and "catalyst solution" are used interchangeably throughout this specification.

The present invention provides a solution for electroless plating including a precious metal nanoparticle and a polymer polymerized from a monomer containing at least a monomer having two or more carboxyl groups or carboxylic acid salt groups. The polymer used in this invention is polymerized from a monomer including at least a monomer having two or more carboxyl groups or carboxylic acid salt groups. In other words, the polymer is polymerized from at least unsaturated polycarboxylic acid or salts thereof, and the polymer has at least two carboxyl groups or carboxylic acid salt groups within the repeating unit of the polymer. The polymer can be a copolymer of unsaturated polycarboxylic acid or salts thereof and another polymerizable monomer. Examples of polycarboxylic acids or salts thereof include maleic acid, fumaric acid and itaconic acid and salts thereof. Maleic acid is preferably used. As shown later the polymer used in the present invention obtains good result with stable catalyst solutions with a wide range of pH in comparison with solutions containing a polymer polymerized from a monomer having one carboxyl group such as polyacrylic acid. The difference between the polymer used in this invention and the polymer polymerized from a monomer having a carboxyl group is the pKa of the solutions containing those polymers. The solution containing the polymer used to this invention has at least two pKa values in comparison with a solution comprising polyacrylic acid which has one pKa (pKa=~4.58).

Though not wishing to be bound by theory it is believed that the polymer of this invention works as buffer as well as stabilizer of precious metal nanoparticles such that the solution comprising the polymer used in this invention has better balance between reactivity and stability of a colloidal catalyst with a wide pH range, and the unique oxygen containing backbone in this polymer may also attribute nanoparticle adsorption in a wide pH range.

Preferably, the polymer used in this invention has an oxygen atom as an ether bond in their principal chain or the polymer backbone. A solution comprising such polymers has specific high catalytic activity with a wide pH range and maintains its stability.

The molecular weight (Mw) of the polymer is 400 to 100,000, more preferably, 800 to 10,000. The higher the Mw the better is the colloidal stability but there is a direct trade off to catalytic activity, i.e. a poor catalytic activity can result.

Examples of a polymer polymerized from a monomer including at least a monomer having two or more carboxyl groups or carboxylic acid groups include polymaleic acid, copolymer of acrylic acid and maleic acid, copolymer of methacrylic acid and maleic acid, copolymer of phosphonic acid and maleic acid, copolymer of acrylic acid and citraconic acid, copolymer of phosphonic acid and citraconic acid and copolymer of sulfonic acid and maleic acid.

Examples of a polymer polymerized from a monomer including at least a monomer having two or more carboxyl groups or carboxylic acid salt groups, and further containing an oxygen atom as an ether bond in their principal chain include polyepoxysuccinic acid, poly[oxy[1-carboxy-1-(carboxymethyl)-1,2-ethanediyl]], copolymer of phosphonic acid and epoxysuccinic acid.

The preferable amount of this polymer is 0.05 to 20 g/L, more preferably, 1.0 to 4.0 g/L, based on the total amount of catalyst solution.

Precious metal nanoparticles of the present solution are provided by any precious metal whenever the metal can work as catalyst. Examples of precious metals are silver, gold, platinum, palladium, rhodium, ruthenium, iridium and osmium. Preferably the precious metal is silver. Mixtures of precious metal can be used, such as a mixture of silver and palladium. The amount of precious metal nanoparticles is 10 to 20,000 ppm, preferably 100 to 10,000 ppm, most preferably 200 to 5,000 ppm based on the weight of the solution.

Optionally, the present invention may comprise one or more of various additives common in electroless plating catalyst compositions, such as surfactants, buffers, complexing agents and pH adjusters. pH adjusters may contain bases such as, but not limited to, sodium hydroxide and potassium hydroxide, and simple acids such as, but not limited to, sulfuric acid, oxalic acid, acetic acid, citric acid and other simple carboxylic acids. The amount and the choice of the pH adjuster are based on the target pH value.

A solvent used in the present invention is preferably water, such as tap water or DI water. Any other solvent such as alcohol, or mixtures of solvents could be used for the present invention whenever the solvent can dissolved with water.

Typically, the present solution has a pH of 3 to 10. The preferable pH of the present solution depends on the type and amount of polymers and reducing agents in nanoparticle preparation procedure. Preferably, the typical present solution has the pH of more than 5, more preferably, the pH is 6 to 9, and still more preferably, the pH is alkaline, that is it has a pH of more than 7 to 9.

The present solutions are stable solutions of nanoparticles useful as a catalyst for electroless plating for non-conductive surfaces of a material to be plated. Preferably, the present solution does not form an observable precipitate. More preferably, the present solution does not form a visually observable precipitate after accelerated aging tests and accelerated shelf life tests. Accelerated aging tests are conducted as putting the solution in a 40° C. bath for one month with air bubbling, and accelerated shelf life tests are conducted by at −20° C. and 60° C. for 48 hours.

The solution of the present invention can be prepared by combining a precious metal ion, a polymer and a reducing agent in a solution. Preferably, the method for preparing a solution of this invention is (a) preparing a solution comprising precious metal ion and a polymer polymerized from a monomer comprising at least a monomer having two or more carboxyl groups or carboxylic acid salt groups, and (b) adding a reducing agent in said solution with stirring.

The precious metal ions used to the present invention are provided by any precious metal source as long as the precious metals can be dissolved in the solvent. Organic or inorganic acids can be used with the precious metal source to help dissolve the precious metals into the solution. Precious metal elements are selected from those which are described above, such as silver, gold, platinum, palladium, rhodium, ruthenium, iridium and osmium. The preferable precious metal element is silver as described above.

Preferable precious metal ion source is organic or inorganic salts of precious metals. Examples of preferable precious metal ion sources include, metal nitrates, metal nitrites, metal halides, metal oxides, metal acetates, metal sulfates, metal sulfites, metal cyanides, metal gluconates, metal fluoroborates, metal alkylsulfonates, metal thiosulfates and metal thiocyanate. Examples of metal salts include, without limitation, silver nitrate, silver acetate, silver sulfate, silver methanesulfonate, silver p-toluenesulfonate, silver benzoate, silver phosphate, silver trifluoroacetate, palladium (II) chloride, platinum (IV) chloride, gold chloride and ruthenium chloride.

The amount of the precious metal ions depends on the solubility of the metal salt and the desired concentration of precious metal nanoparticles in the solution of the present invention. For example, silver salts may be used in amounts of 0.01 to 100 g/L, preferably, 0.1 to 10 g/L, more preferably, 0.1 to 5.0 g/L as metal, based on the total amount of catalyst solution.

The reducing agents used for reducing the precious metal ions are any of those reducing agents capable of reducing dissolved precious metal ions to a reduced precious metal form without formation of by-products that would interfere with catalysis of the catalyst solution. Preferable reducing agents are dimethylamino borane, sodium borohydride, hydrazine, sodium hypophosphite, hydrazine hydrate, ascorbic acid, iso-ascorbic acid, hydroxylamine sulfate, formic acid and formaldehyde.

The amount of reducing agent is any amount sufficient to reduce the desired precious metal ion. The preferable amount of reducing agent may be determined by the ratio with the precious metal, such as 0.5 to 2 times the moles of precious metal ions. Typically, the amount is 0.01 to 10 g/L, more preferably, 0.05 to 5 g/L, based on the total amount of metal concentration in the catalyst solution and the choice of reducing agent used in the reaction.

A method for preparing a solution of the present invention is (a) preparing a solution comprising precious metal ion and a polymer polymerized from a monomer comprising at least a monomer having two or more carboxyl groups or carboxylic acid salt groups and (b) adding a reducing agent in said solution with stirring.

The first step of the method is the step of preparing a solution including precious metal ions and a polymer polymerized from a monomer comprising at least a monomer having two or more carboxyl groups or carboxylic acid salt groups. The solution includes precious metal ions and the polymer can be prepared by any method. For example, dissolve the polymer in a solvent such as water, then add a salt of precious metal or aqueous solution of precious metal salt into the solvent, or dissolve a precious metal ion in a solvent and then add the polymer or a solution of the polymer into the solvent.

The second step of the method is the step adding a reducing agent into the solution with. The amount of reducing agent used in the step is any amount sufficient to form the desired precious metal nanoparticles.

Reducing agent is added in the above solution with stirring. Under strong stirring conditions, the metal ions may be reduced to metal and quickly form a lot of nanocrystals and serve as seeds for further particle growth. If the stirring is inadequate, the particle sizes may be non-uniform and some of the particles may grow larger and may precipitate easily. In other words strong stirring allows the formation of smaller nanoparticles in a narrower particle size distribution. The typical mixing rates may be from 200 to 1000 rpm.

The temperature of the solution during the second step is 10 to 40° C., typically around room temperature or 20° C.

Though not wishing to be bound by theory, the inventors believe the mechanism of forming stable precious metal nanoparticles in the presence of a polymer of this invention is as follows: generally, the nanoparticles have a tendency to collide with each other due to Brownian motion, convection, gravity and other forces, which may result in aggregation and destabilization of the colloid. Electrostatic stabilization and steric stabilization of colloids are the common two mechanisms for colloid stabilization. With the presence of polymer, the as prepared nanoparticles may be surrounded by the polymeric molecules, and the polymeric molecules create a repulsive force counterbalancing the attractive Van der Waals force among particles.

The preferred method for preparing colloidal catalyst solutions is preparing a solution comprising 1 to 5 g/L of silver ions and 1 to 5 g/L of polyepoxysuccinic acid, then adding 10 to 80 mmol/L of dimethylamino borane under strong stirring of 200 to 1,000 rpm at 20 to 40° C.

The solution containing the precious metal nanoparticles and a polymer polymerized from a monomer including at least a monomer having two or more carboxyl groups or carboxylic acid salt groups, colloidal catalyst of this invention, can be used in the electroless plating process for printed circuit boards. Through-holes are formed in the printed circuit boards by drilling or punching or any other method known in the art. After the formation of the through-holes, the boards are rinsed with water and a conventional organic solution to clean and degrease the boards followed by desmearing the through-hole walls is applied. Typically, desmearing of the through-holes begins with application of a solvent swell.

Any conventional solvent swell may be used to desmear the through-holes. Solvent swells include, but are not limited to, glycol ethers and their associated ether acetates. Conventional amounts of glycol ethers and their associated ether acetates may be used. Such solvent swells are well known in the art. Commercially available solvent swells include, but are not limited to, CIRCUPOSIT CONDITIONER™ 3302, CIRCUPOSIT HOLE PREP™ 3303 and CIRCUPOSIT HOLE PREP™ 4120 solutions all obtainable from Rohm and Haas Electronic Materials, Marlborough, Mass.

Optionally, the through-holes are rinsed with water. A promoter is then applied to the through-holes. Conventional promoters may be used. Such promoters include sulfuric acid, chromic acid, alkaline permanganate or plasma etches. Typically alkaline permanganate is used as the promoter. An example of a commercially available promoter is CIRCUPOSIT PROMOTER™ 4130 solution available from Rohm and Hass Electronic Materials.

Optionally, the through-holes are rinsed again with water. A neutralizer is then applied to the through-holes to neutralize any residues left by the promoter. Conventional neutralizers may be used. Typically the neutralizer is an aqueous alkaline solution containing one or more amines or a solution of 3 wt % peroxide and 3 wt % sulfuric acid. Optionally, the through-holes are rinsed with water and the printed circuit boards are dried.

After desmearing an acid or alkaline conditioner may be applied to the through-holes. Conventional conditioners may be used. Such conditioners may include one or more cationic surfactants, non-ionic surfactants, complexing agents and pH adjusters or buffers. Commercially available acid conditioners include, but are not limited to, CIRCUPOSIT CONDITIONER™ 3320 and CIRCUPOSIT CONDITIONER™ 3327 solutions available from Rohm and Haas Electronic Materials. Suitable alkaline conditioners include, but are not limited to, aqueous alkaline surfactant solutions containing one or more quaternary amines and polyamines. Commercially available alkaline surfactants include, but are not limited to, CIRCUPOSIT CONDITIONER™ 231, 3325, 813 and 860 solutions available from Rohm and Haas Electronic Materials. Optionally, the through-holes are rinsed with water after conditioning.

Conditioning is followed by microetching the through-holes. Conventional microetching compositions may be used. Microetching is designed to provide a micro-roughened copper surface on exposed copper, e.g., innerlayers and surface etch, to enhance subsequent adhesion of deposited electroless and electroplate. Microetches include, but are not limited to, 60 g/L to 120 g/L sodium persulfate or sodium or potassium oxymonopersulfate and 2% sulfuric acid mixture, or generic sulfuric acid/hydrogen peroxide. An example of a commercially available microetching composition includes CIRCUPOSIT MICROETCH™ 3330 solution available from Rohm and Haas Electronic Materials. Optionally, the through-holes are rinsed with water.

A pre-dip is then applied to the microeteched through-holes. Any acidic solution capable of removing copper oxides on copper surfaces without interfering with the catalyst solution can be used. Examples of pre-dips include oxalic acid, acetic acid, ascorbic acid, phenolic acid, phosphoric acid, boric acid, and salts thereof. Optionally, the through-holes are rinsed with cold water.

A catalyst, a solution comprising a precious metal nanoparticle, as described above is then applied to the through-holes. The walls of the through-holes are then plated with copper with an alkaline electroless composition. Any conventional electroless plating bath may be used. A commercially available electroless copper plating bath includes, but are not limited to, CIRCUPOSIT™ 880 Electroless Copper plating bath available from Rohm and Haas Electronic Materials.

After the copper is deposited on the walls of the through-holes, the through-holes are optionally rinsed with water. Optionally, anti-tarnish compositions may be applied to the metal deposited on the walls of the through-holes. Conventional anti-tarnish compositions may be used. Examples of anti-tarnish compositions include ANTI TARNISH™ 7130 and CUPRATEC™ 3 compositions obtainable from Rohm and Haas Electronic Materials. The through-holes may optionally be rinsed with hot water at temperatures exceeding 30° C. and then the boards may be dried.

The following examples are intended to further illustrate the invention but are not intended to limit the scope of the invention.

EXAMPLES

Test Method

The properties of the catalyst were evaluated by observing test coupons plated with electroless copper plating according to the process described below. Conventional FR-4 laminate, SY-1141 (normal $T_g$) from Shengyi was used as the test coupon. For surface coverage test, a bare laminate was used. For backlight tests, Cu clad laminate with an inner layer copper was used.

(1) The test coupon was cut into 1×6 cm² pieces and its edges were sandblasted by SiC#240 particles, then cleaned in RO (Reverse osmosis) water for several times and blown dried.
(2) The test coupon was processed through the swelling, oxidizing, neutralizing, conditioning and microetching steps shown in table 1.
(3) The test coupon was dipped in the catalyst solution at 40° C. for 10 minutes at various pH values (2.9 to 10.9, shown in each examples). The test coupon was washed with deionized water.
(4) The test coupon was plated by electroless copper plating at 35 or 40° C. for 15 minutes.

TABLE 1

Process Flow for Electroless Cu Deposition tests

| | Process | Components | Volume | Temperature [° C.] | Duration [min] | Rinse time [min] |
|---|---|---|---|---|---|---|
| 1 | Sweller | Hole Promoter 211 CUPOSIT ™ Z | 12.5% 10.0% | 80 | 7 | 3 |
| 2 | Oxidizer | Oxidizer 213A-1 CUPOSIT ™ Z | 10.0% 15.0% | 80 | 10 | 3 |
| 3 | Neutralizer | Neutralizer 216-5 | 5.0% | 42 | 5 | 3 |
| 4 | Conditioner | Cleaner Conditioner 231 | 3.0% | 43 | 5 | 4 |
| 5 | MicroEtch | Sodium Persulfate $H_2SO_4$ | 75 g/L 2.0% | RT | 2 | 3 |
| 6 | Catalyst | Ag: 270 ppm | 25.0% | 40 | 10 | 3 |
| 7 | Electroless Copper | CIRCUPOSIT ™ 880 Electroless Copper | Nil | 40 | 15 | 2 |

1. Plating Coverage Test

Plating coverage of the test coupon was assessed using the plating coverage grading scale defined below.
Full coverage—more than 95% of the area on the surface of test coupon was plated.
High—more than 75% and less than 95% of the area on the surface of test coupon was plated.
Medium—more than 50% and less than 75% of the area on the surface of test coupon was plated.
Low—more than 5% and less than 50% of the area on the surface of test coupon was plated.
No Coverage—less than 5% of the area on the surface of test coupon was plated.

2. Backlight Test

Backlight testing was conducted according to the process below.
1-mm-thick cross sections from each board were placed under a conventional optical microscope of 50× magnification under transmission mode. The quality of the copper deposit was determined by the amount of light that was observed under the microscope and compared with the European backlight Grading Scale (0-5). If no light was observed, the section was completely black and was rated 5.0 on the backlight scale. This indicated complete copper coverage. If light passed through the entire section without any dark area, this indicated very little to no copper metal deposition on the walls and the section was rated 0. If sections had some dark regions as well as light regions, they were rated between 0 and 5 comparing with the standard.

3. ICD Test

Reliability of plating was measured by the following ICD test (Interconnect defects test)
A drilled MLB (multi-layer board) coupon containing at least 30 holes with 1 mm hole diameters was cut. The coupon edges were ground by SiC paper with Grit#240. Ultrasonic cleaning in RO water was performed for several times. The process was run from desmear to PTH (plating through the hole) and finally to copper electroplating. Any Cu on each edge of the coupon was ground away. The coupon was backed at 125° C. for 6 h. Cooled down in dry cabinet. Alternative solder dip at 288° C. for 10 seconds, and cooled at RT for 110 seconds. The process was repeated for 6 times.

Micro-section of the coupons was performed and investigated for ICDs before etching. The number of defects and interconnecting regions were counted and calculated as the rate.

The coupons were etched by an ammonia solution (20 ml ammonium solution, 20 ml water and 10 drops hydrogen peroxide). The ICDs were reconfirmed.

4. Accelerated Aging Test (AAT)

The accelerated Aging Test was conducted as follows:
A concentrate catalyst working bath was prepared with a fixed volume of 50 mL, and then the solution was subjected to accelerated aging tests by bubbling air at a rate of 10 mL/min under a bath temperature maintained at 40° C. for 7 days or a few weeks. After that coverage tests and backlight tests were carried out using these accelerated aging catalyst working baths to identify whether the catalytic activity was lost or not. Meanwhile, other corresponding tests such as UV-vis absorption were also carried out.

Catalyst Preparation Example 1

Ag-PESA Catalyst System

Step 1: 3.3 g of sodium salt of polyepoxysuccinic acid (Mw=400-1,500) was weighed out and then mixed with 3,000 ml of deionized water into a 5 liter beaker with stirring. 5 g of silver nitrate were added into the solution with stirring.

Step 2: 15 ml of freshly prepared 2.0 mol/L dimethylaminoborane (DMAB) was quickly injected into the above solution with strong stirring at 500 rpm using a magnetic stirrer. Stirring was done for over 2 h.

Examples 1 to 4

4 Ag-PESA Catalyst System

Ag-PESA catalyst solution was prepared as in Catalyst Preparation Example 1 except silver nitrate was changed to different silver salts as shown in Table 2.

Performance tests were conducted for the catalyst solutions of Examples 1 to 4. 200 ppm of each catalyst solution (Ag-PESA system) was used. The results of the backlight tests were shown in Table 2.

TABLE 2

Backlight Test Results

| Examples | Types of Silver Salt | pH 4 | pH 5 | pH 7 | pH 9 |
|---|---|---|---|---|---|
| 1 | Nitrate | 4.4 | 4.4 | 4.3 | 3.8 |
| 2 | Acetate | 4.6 | 4.4 | 4.3 | 3.8 |
| 3 | Methanesulfonate | 4.5 | 4.4 | 3.7 | 3.8 |
| 4 | p-toluenesulfonate | 4.8 | 4.6 | 4.3 | 4 |

These catalysts showed high backlight test results between pH=4 to pH=7, thus having a wide window of operation.

Coverage tests and backlight tests were conducted for the catalyst of Example 1 before and after the Accelerated Aging Test (AAT). 200 ppm of catalyst solution (Ag-PESA system) was used. The results are shown in Table 3 and Table 4.

TABLE 3

| | Before AAT | | After AAT | |
|---|---|---|---|---|
| | Init. Time (sec) | Coverage | Init. Time (sec) | Coverage |
| pH = 4 | 20 | Full | 1 | Full |
| pH = 5 | 20 | Full | 1 | Full |
| pH = 7 | 20 | Full | 1 | Full |

'Init. Time' means Initiation Time. It is the time required in achieving a noticeable electroless copper deposition on a bare laminate. It is determined by the color change of the laminate from yellow to opaque.

TABLE 4

| | Before AAT | | | After AAT | | |
|---|---|---|---|---|---|---|
| pH/ catalyst WB | Average BL rating | Void type (95% voiding on gl) | Morphology | Average BL rating | Void type (95% voiding on gl) | Morphology |
| pH = 4 | 4.4 | SROP, STAG, STOG | sR-gl | 4.3 | SROP, STAG, STOG | sR-gl |
| pH = 5 | 4.4 | SROP, STAG, STOG | sR-gl | 4.6 | SROP, STAG, STOG | sR-gl |
| pH = 7 | 4.3 | ROP, STAG, STOG | sR-gl | 4.1 | ROP, STAG, STOG, TGV, GTV | R-gl |

'Void type' shows electroless copper deposition defects. The state of deposition was classified by the grades below.
TAG: thin plating around glass
STAG: slightly thin plating around glass
TOG: thin copper plating on glass
STOG: slightly thin copper plating on glass
TGV: transverse glass voids
GTV: glass tip voids
ROP: ring of pearls
SROP: slightly ring of pearls
'Morphology' shows the deposited electroless copper morphology on glass fiber which was determined by using an optical microscope under front-light illumination mode. The classified grades are shown below.
VR-gl: very rough on glass fiber
R-gl: rough on glass fiber
sR-gl: slightly rough on glass fiber Examples 5-12

Ag-CP5 Catalyst System

Ag-CP5 catalyst solution was prepared as in Catalyst Preparation Example 1 except PESA was changed to a copolymer of acrylic acid and maleic acid, sodium salt (Mw=70,000, Sokalan CP5, BSAF chemical company) and the concentration of each ingredient was changed as shown in Table 5.

TABLE 5

| Example | Ag (ppm) | Sokalan CP5 (g/L) | DMAB (mmol/L) | Temperature (degree C.) | pH |
|---|---|---|---|---|---|
| 5 | 108 | 1.0 | 2 | 25 | 9.4 |
| 6 | 216 | 1.0 | 4 | 25 | 8.6 |
| 7 | 432 | 1.0 | 8 | 25 | 7.9 |
| 8 | 864 | 1.0 | 16 | 25 | 6.2 |
| 9 | 1080 | 1.0 | 20 | 25 | 5.5 |
| 10 | 1620 | 1.0 | 30 | 25 | 5.4 |
| 11 | 2160 | 1.0 | 40 | 25 | 5.2 |
| 12 | 3240 | 1.0 | 60 | 25 | 4.9 |

Performance tests were conducted for a catalyst solution prepared as in Example 10. 270 ppm of catalyst solution (Ag-CP5 system) was used. The results are shown in Table 6.

TABLE 6

| | Test pH | | | | |
|---|---|---|---|---|---|
| | 2.9 | 4.0 | 4.5 | 5.0 | 6.9 |
| Coverage | Full | Full | Full | Full | Low |
| Backlight | 4.3 | 4.5 | 4.3 | 4 | NA |
| Void type | GTV, TGV | GTV, TGV, SROP | GTV, TGV, SROP | GTV, TGV, ROP | |
| Morphology | R-gl | R-gl | R-gl | sR-gl | |

This catalyst showed high backlight test results between pH 2.9 to pH 5.0, thus it had a wide window of operation.

Comparative Examples 1-4

Ag-PAA System

Ag-PAA solution was prepared as in Example 1 except PESA was changed to a polyacrylic acid (Mw=100,000, 35% in water, from Aldrich) and the concentration of each ingredient was changed as shown in Table 7.

TABLE 7

| Comparative Example | Ag (ppm) | PAA (g/L) | DMAB (mmol/L) | Temperature (degree C.) | pH |
|---|---|---|---|---|---|
| 1 | 1080 | 0.5 | 10 | 22.0 | 2.8 |
| 2 | 1080 | 1.0 | 10 | 22.0 | 2.7 |
| 3 | 1080 | 2.0 | 10 | 22.0 | 2.6 |
| 4 | 1080 | 4.0 | 10 | 22.0 | 2.4 |

A performance test was conducted for the catalyst of Comparative Example 1. 270 ppm of catalyst solution (Ag-PAA system) was used. The results were shown in Table 8.

TABLE 8

| | Test pH | | |
|---|---|---|---|
| | 3.5 | 4.5 | 6.0 |
| Coverage | Full | Full | Full |
| Backlight | 4.3 | 4.3 | 2.3 |

This catalyst showed high backlight test results between pH 3.5 to pH 4.5 thus the window of operation of this catalyst was narrower compared with Examples 1-4 and 10.

Comparative Example 5

Ag-Citrate System

Ag-Citrate solution was prepared as in Catalyst Preparation Example 1 except PESA was changed to citrate. Performance tests were conducted at pH 3, 6, 9 and 12. Only the test done at pH=9 showed backlight test results of more than pH 4, thus the window of operation for this catalyst was narrower compared with the results of Examples 1-4 and 10.

As disclosed in the Examples and contrasted with the Comparative Examples, the solution of the present invention (the solution comprising precious metal nanoparticles and a polymer polymerized from a monomer including at least a monomer having two or more carboxyl groups or carboxylic acid salt groups) had high adsorption capability and catalytic activity as well as good bath stability through a wide range of pH values compared with the solution which contained the other components. In particular, the solution containing Ag nanoparticles and sodium salt of polyepoxysuccinic acid had higher adsorption and catalytic activity, a wider operation window (effective through wide range of pH) as well as good bath stability. In addition, the solution containing Ag nanoparticles and sodium salt of polyepoxysuccinic acid did not contain a nitrogen atom and phosphorous group which may present environmental problems thus the solution is a green solution.

What is claimed is:

1. A solution comprising a precious metal nanoparticle and polyepoxysuccinic acid or salts thereof.

2. The solution of claim 1, wherein the precious metal is silver, gold, platinum, palladium, rhodium, ruthenium, iridium or osmium.

3. A process for electroless plating a metal on non-conductive surface, the process comprises the steps of;
    a) dipping a substrate to be plated into a solution comprising a precious metal nanoparticle and a polymer, the polymer is polymerized from a monomer comprising at least a monomer having two or more carboxyl groups or carboxylic acid salt groups; and
    b) conducting electroless plating of the substrate without an accelerating step.

4. The process of claim 3, wherein the polymer has an oxygen atom as an ether bond in a principal chain.

5. The process of claim 4, wherein the polymer is polyepoxysuccinic acid or salts thereof.

6. The process of claim 3, wherein the polymer is polymaleic acid or polymer polymerized by a maleic acid and another polymerizable monomer chosen from acrylic acid, methacrylic acid, phosphonic acid and sulfonic acid.

7. The process of claim 3, wherein the polymer comprises monomers of acrylic acid and citraconic acid or phosphonic acid and citraconic acid.

8. The process of claim 3, wherein the precious metal is silver, gold, platinum, palladium, rhodium, ruthenium, iridium or osmium.

* * * * *